United States Patent
Yano et al.

(10) Patent No.: US 7,940,065 B2
(45) Date of Patent: May 10, 2011

(54) PROBE APPARATUS AND METHOD FOR MEASURING ELECTRICAL CHARACTERISTICS OF CHIPS

(75) Inventors: Kazuya Yano, Nirasaki (JP); Hiroshi Shimoyama, Nirasaki (JP); Masaru Suzuki, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 138 days.

(21) Appl. No.: 12/363,110

(22) Filed: Jan. 30, 2009

(65) Prior Publication Data

US 2009/0195263 A1 Aug. 6, 2009

(30) Foreign Application Priority Data

Jan. 31, 2008 (JP) .................. 2008-021434

(51) Int. Cl.
*G01R 31/00* (2006.01)
*G01R 31/02* (2006.01)
(52) U.S. Cl. .......... 324/750.16; 324/750.19; 324/750.22
(58) Field of Classification Search .................. None
See application file for complete search history.

(56) References Cited

U.S. PATENT DOCUMENTS

| | | | | |
|---|---|---|---|---|
| 6,111,421 A | * | 8/2000 | Takahashi et al. | ............. 324/758 |
| 6,297,656 B1 | * | 10/2001 | Kobayashi et al. | ............. 324/758 |
| 6,906,546 B2 | | 6/2005 | Tanioka et al. | |
| 7,405,584 B2 | * | 7/2008 | Fujita et al. | ..................... 324/758 |
| 7,719,297 B2 | * | 5/2010 | Takabe et al. | ................. 324/758 |

FOREIGN PATENT DOCUMENTS

| | | |
|---|---|---|
| JP | 8-250558 | 9/1996 |
| JP | 2004-152916 | 5/2004 |
| KR | 10-0754543 | 9/2007 |

OTHER PUBLICATIONS

Korean Office Action issued Nov. 11, 2010, in Patent Application No. 10-2009-0007583 (with English-language translation).

* cited by examiner

*Primary Examiner* — Vinh P Nguyen
(74) *Attorney, Agent, or Firm* — Oblon, Spivak, McClelland, Maier & Neustadt, L.L.P.

(57) ABSTRACT

A probe apparatus includes a first stage, a second stage, a third stage and an image pickup. A Z position measuring unit measures a Z direction position of the mounting table and has a Z scale extending in the Z direction and a reading unit for reading the Z scale. A computation unit obtains a calculated contact position between the probes and the electrode pads of the substrate to be inspected based on images picked up by the image pickup with respect to a coordinate position on coordinates of a driving system which includes a Z direction position and X and Y direction positions measured by a measuring unit for measuring X and Y direction positions of the mounting table. A correcting unit corrects the Z direction position of the contact position based on the change amount thereof for a next contact operation.

6 Claims, 9 Drawing Sheets

PROBE APPARATUS AND METHOD FOR MEASURING ELECTRICAL CHARACTERISTICS OF CHIPS

FIELD OF THE INVENTION

The present invention relates to a technical field of a probe apparatus for sequentially measuring electrical characteristics of chips to be inspected by bringing probes of a probe card into contact with electrode pads of the chips to be inspected by moving a mounting table which mounts thereon a substrate to be inspected on which the chips to be inspected are arranged.

BACKGROUND OF THE INVENTION

Conventionally, in order to test electrical characteristics of IC chips formed on a semiconductor wafer, a probe test is performed on the wafer by using a probe apparatus. The probe apparatus includes a wafer stage capable of moving in X, Y and Z directions and rotating about a Z axis and is configured to test the electrical characteristics of the IC chips by brining probes, e.g., probe needles, of a probe card provided above the wafer stage into contact with electrode pads of the IC chips of the wafer, and controls a position of the wafer stage so that the probe needles are brought into contact with the electrode pads. The wafer stage is driven in X, Y and Z directions by a driving unit, and the position thereof is controlled by linear scales provided on three stages moving along X, Y and Z directions which mount thereon the wafer stage or by a detected value of an encoder of a pulse motor (value calculated based on a detected pulse). In other words, the wafer stage moves on coordinates of a driving system managed by the detected value.

After a camera picks up images of specific points on the wafer and the probe needles, the position (contact position) on X, Y and Z coordinates of the driving system to bring the electrode pads of the wafer into contact with the probe needles can be obtained by a computation based on the position of the camera and the result of the picked up images. Next, the probe needles are brought into contact with the wafer. In that state, the wafer stage is slightly raised so as to apply an overdrive to scratch a natural oxide film by the probe needles. The test is performed while contacting the probe needles with the electrode pads (Patent Document 1).

In this probe apparatus, when the test is carried out, the wafer stage for mounting thereon the wafer may be heated to a predetermined temperature (set temperature) and, thus, the wafer stage may be provided with a heating unit and a temperature detecting unit.

Further, when the test is performed by heating the wafer, the contact position is determined by a computation after confirming that the temperature detecting unit has detected that the surface of the wafer stage has been heated to the set temperature to control the position of the wafer stage. However, when the wafer stage has been heated, even if the surface of the wafer stage has reached to the set temperature, a long period of time is required to uniformly heat an entire stage assembly (XYZ table) including the wafer stage. As a consequence, the coordinates positions of the mounting surface of the wafer stage keep changing after the images picked up by the camera, e.g., during the measurement.

Due to the miniaturization of the electrode pads, if the actual contact position between the electrode pads and the probe needles is shifted from its target contact position in X and Y directions, the probe needles can be positioned outside the electrode pads and, thus, they may not contact with each other securely. Moreover, if the actual contact position between the electrode pads and the probe needles is shifted from its target contact position in Z direction, for example, if the actual contact position is shifted from its target contact position toward the prove needles side, the probe needles can penetrate into the electrode pads. On the contrary, if the actual contact position is shifted from its target contact position toward the electrode pad side, the probe needles and the electrode pads cannot be brought into contact with each other. As a result, the reliability of the measurement deteriorates.

In Patent Document 1, the stability to the temperature change is increased by equalizing thermal expansion coefficients of the base table, the camera and the probe card and arranging the respective components so that the effects of the thermal expansion thereto can be minimized. However, the above problems cannot be solved by the apparatus of Patent Document 1.

(Patent Document 1) Japanese Patent Laid-open Application No. 2004-152916 (Paragraphs 0018 and 0019)

SUMMARY OF THE INVENTION

In view of the above, the present invention provides a probe apparatus capable of performing highly reliable measurement and providing excellent contact precision by automatically correcting an error that may occur between an actual contact position and a calculated contact position due to thermal expansion during the measurement, a probing method and a storage medium which stores a program for performing the method.

In accordance with an aspect of the present invention, there is provided a probe apparatus for measuring electrical characteristics of chips to be inspected while bringing probes of a probe card into contact with electrode pads of the chips by moving a mounting table which mounts thereon a substrate to be inspected where the chips are arranged, the probe apparatus including: a first stage provided on a base table so as to be movable in an X direction; a second stage provided on the first stage so as to be movable in a Y direction; a third stage provided on the second stage so as to be movable in a Z direction and having the mounting table; and an image pickup for picking up images of the probes and the substrate to be inspected on the mounting table.

The probe apparatus further includes: a Z position measuring unit which acquires a Z direction position of the mounting table and has a Z scale extending in the Z direction and a reading unit for reading the Z scale, the Z scale being provided at one side of the second and the third stage, the reading unit being provided at the other side of the second and the third stage; a computation unit for obtaining a calculated contact position between the probes and the electrode pads of the substrate based on images picked up by the image pickup with respect to a coordinate position on coordinates of a driving system which includes a Z direction position and X and Y direction positions measured by a measuring unit for measuring X and Y direction positions of the mounting table; and a correcting unit for correcting, when the Z direction position of the mounting table measured by the Z position measuring unit is different from a preset calculated contact position in a state where the probes contact with the electrode pads of the substrate, the Z direction position of the contact position based on a change amount thereof for a next contact operation.

It is preferable that the third stage has a heating unit for heating the substrate to be inspected mounted on the mounting table.

Further, the measuring unit for measuring the X direction position of the mounting table may have an X scale extending in the X direction and a reading unit for reading the X scale, the X scale being fixed to one side of central portions in the X direction of the base table and the first stage, the reading unit being provided at the other side of the base table and the first stage.

Furthermore, the measuring unit for measuring the Y direction position of the mounting table may have a Y scale extending in the Y direction and a reading unit for reading the Y scale, the Y scale being fixed to one side of central portions in the Y direction of the first and the second stage, the reading unit being provided at the other side of the first and the second stage.

In accordance with an another aspect of the present invention, there is provided a probing method for measuring electrical characteristics of chips to be inspected by bringing probes of a probe card into contact with electrode pads of the chips by moving a mounting table which mounts thereon a substrate to be inspected on which the chips are arranged, a probe apparatus including: a first stage provided on a base so as to be movable in an X direction; a second stage provided on the first stage so as to be movable in a Y direction; a third stage provided on the second stage so as to be movable in a Z direction and having the mounting table; and a Z position measuring unit which measures a Z direction position of the mounting table and has a Z scale extending in the Z direction and a reading unit for reading the Z scale, the Z scale being provided at one side of the second and the third stage, the reading unit being provided at the other side of the second and the third stage.

Further, the probing method includes: performing a computation to obtain a calculated contact position between the probes and the electrode pads of the substrate based on pickup images of the probes and the substrate to be inspected on the mounting table with respect to a coordinate position on coordinates of a driving system which includes a Z direction position and X and Y direction positions measured by a measuring unit for measuring X and Y direction positions of the mounting table; and correcting, when the Z direction position of the mounting table measured by the Z position measuring unit is different from a preset calculated contact position in a state where the probes contact with the electrode pads of the substrate, the Z direction position of the contact position based on a change amount thereof for a next contact operation.

It is preferable that a storage medium may store computer programs used in a probe apparatus for inspecting electrical characteristics of chips to be inspected while contacting electrode pads of the chips to be inspected with probes of a probe card by moving a mounting table which mounts thereon a substrate to be inspected on which the chips are arranged, the mounting table being movable in X, Y and Z direction by a driving unit, wherein the computer programs are designed to perform the above-described probing method.

In accordance with the present invention, the reference chuck of a third scale (Z scale) is fixed to the third stage, and the scan head is fixed to the non-driving unit of the third stage. Further, due to the presence of the third scale (Z scale), it is possible to measure the moving amount and the displacement of the driving unit of the third stage having the mounting surface. Therefore, in the present invention, the displacement of the moving amount of the third stage to the contact position can be detected. When the displacement is detected, the contact position in the Z-axis can be corrected by the control unit based on the displacement amount. Accordingly, in the present invention, even if the error occurs in the contact position due to thermal expansion and the like during the measurement, the error can be automatically corrected. Further, excellent precise contact between the probes and the electrode pads is provided, so that the reliability in the measurement of the electrical characteristics can be improved.

BRIEF DESCRIPTION OF THE DRAWINGS

The objects and features of the present invention will become apparent from the following description of embodiments, given in conjunction with the accompanying drawings, in which.

DETAILED DESCRIPTION OF THE EMBODIMENTS

Hereinafter, embodiments of the present invention will be described with reference the accompanying drawings which form a part hereof.

Figure 1:
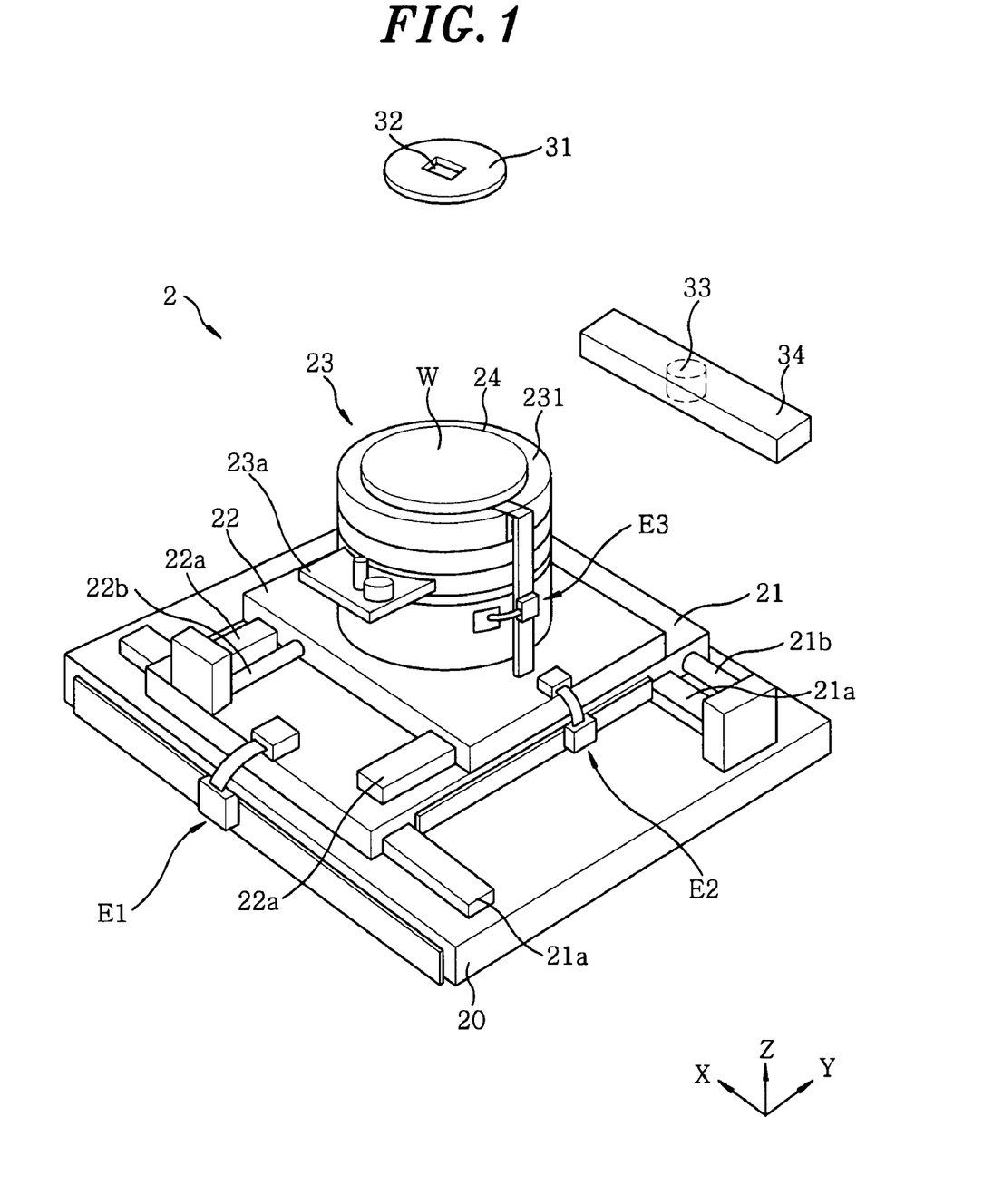
FIG. 1 is a schematic perspective view showing an entire probe apparatus 1 of an embodiment of the present invention.

As shown in FIG. 1, a probe apparatus 1 of the present embodiment includes a base table 20. Provided on the base table 20 is a first stage 21 that is supported to be movable on two parallel first guide rails 21a extending in an X direction. The first stage 21 moves in an X direction by a driving force of a motor (not shown) connected to a first ball screw 21b that axially moves the first stage 21. Further, as the first stage 21 is provided in the above-described manner, a second stage 22 is provided on the first stage 21 and is supported to be movable on two parallel second guide rails 22a in a Y direction, and a second ball screw 22b axially moves the second stage 22. For convenience, the X and Y directions in the present embodiment indicate both sides of orthogonal coordinate axes on a plane. The X and Y directions in the present invention are not limited to the X and Y directions specified in the present embodiment.

Provided on the second stage 22 is a third stage 23 moving in a Z direction by a motor (not shown). A third stage moving body 231 of the third stage 23 is provided with a chuck top (mounting table) 24 capable of rotating about a Z-axis by a minute angle (capable of moving in a θ direction by about 1° rightward and leftward). That is, in the probe apparatus 1 of the present embodiment, the wafer W can move in the X, Y, Z and θ directions by using the first to the third stage 21 to 23 and the chuck top 24 as a driving unit. The first to the third stage 21 to 23 form an XYZ stage 2. Moreover, the third stage 23 has a heating unit 23d for heating the wafer (substrate to be inspected) W mounted on the chuck top 24 and a coolant circulation unit 23e for cooling the wafer W. The coolant circulation unit 23e is connected with a coolant supply line 23g for supplying a coolant and a coolant discharge line 23f for discharging the coolant.

Figure 2:
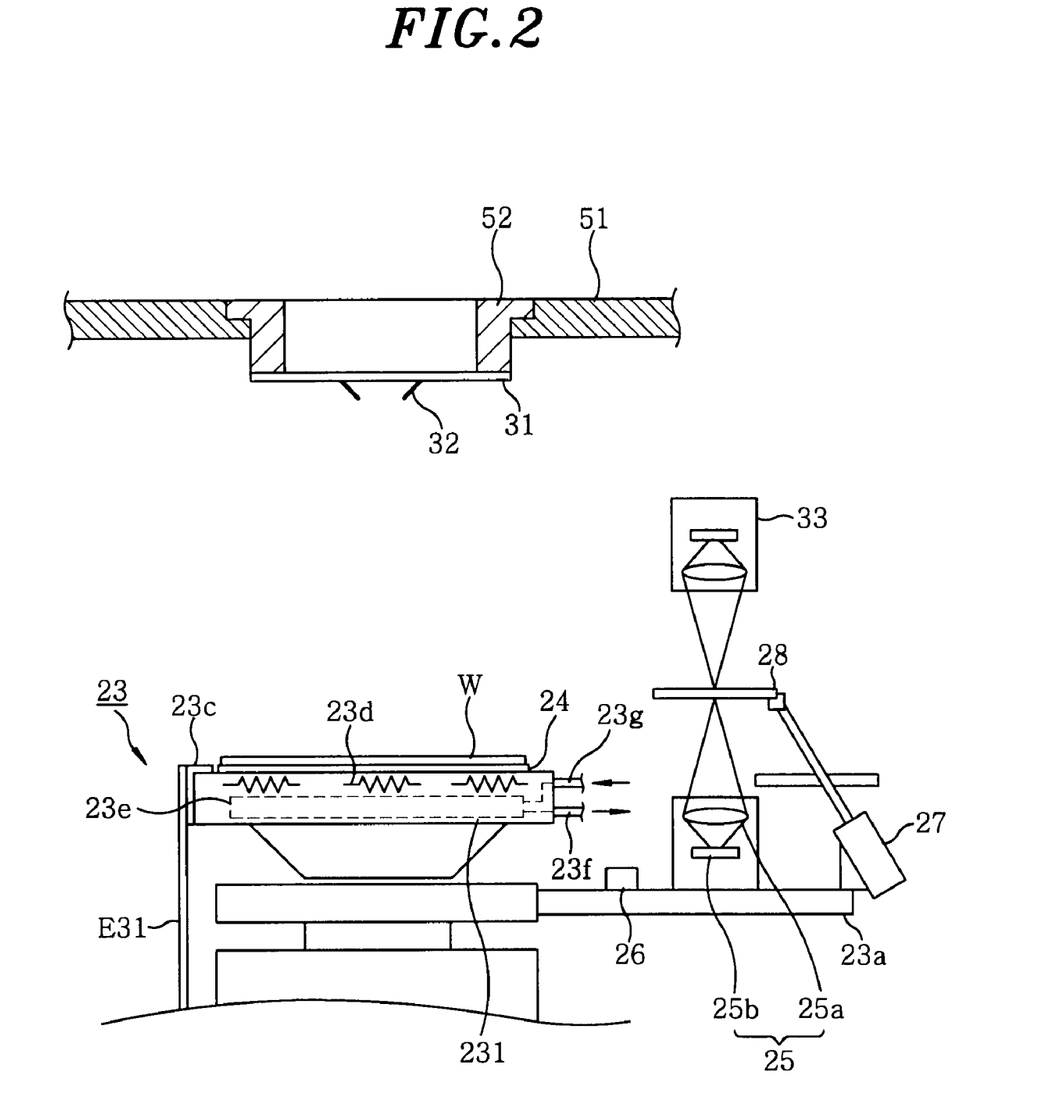
FIG. 2 describes a side view of an upper portion of the probe apparatus 1 of the embodiment of the present invention.

A probe card 31 is disposed above the chuck top 24, and is attached to a head plate 51 corresponding to a ceiling portion of a casing of the probe apparatus 1 via an insert ring 52. The probe card 31 has on a top surface thereof a group of electrodes electrically connected with a test head (not illustrated). Provided on a bottom surface of the probe card 31 are probes, e.g., probe needles 32, electrically connected with the group of electrodes. The probe needles 32 are made of, e.g., metal wire extending downward slantingly, and are disposed in accordance with the arrangement of the electrode pads of the wafer W. As for the probes 32, there may be used vertical needles (wire probe needles) extending perpendicular to the surface of the wafer W, gold bump electrodes formed on a flexible film or the like.

The third stage 23 is provided with a fixing plate 23a, and a first image pickup unit 25 serving as a lower camera is mounted on the fixing plate 23a. The first image pickup unit 25 includes a combination of an optical system 25a and a CCD camera 25b of high magnification so as to pick up enlarged images of needle tips of the probe needles 32. Further, a camera 26 of low magnification is fixed near the first image pickup unit 25 so as to pick up an image of the arrangement of the probe needles 32 in a wide area. In addition, a target 28 is provided on the fixing plate 23a so that it can move back and forth by a reciprocating mechanism 27 in a direction crossing an optical axis of the first image pickup unit 25 at a plane on which the first image pickup unit 25 focuses.

In an area between the chuck top 24 and the probe card 31, a second image pickup unit 33 having a substantially same configuration as that of the first image pickup unit 25 is fixed to a moving body 34, and is movable in the Y direction along a guide (not shown). Moreover, it is constructed so that an image of the target 28 can be recognized by the first image pickup unit 25 and the second image pickup unit 33. For example, a subject for alignment is formed on a transparent glass plate.

In the probe apparatus 1 of the present embodiment, the first to the third stage 21 to 23 have the first to the third linear scale E1 to E3 that are typical features of the present invention. The first to the third linear scale E1 to E3 are respectively provided with reference chucks E11, E21 and E31 having slits formed at regular intervals of a predetermined density, scan heads E12, E22 and E32 each including a signal processing circuit and a detection system which has a light emitting unit and a light receiving sensor, fixing units E13, E23 and E33 fixing the scan heads E12, E22 and E32 so that the reference chucks E11, E21 and E31 can be read by the scan heads E12, E22 and E32, and supporting members E14, E24 and E34.

While performing position measurement by the first to the third linear scale E1 to E3, the position measurement is performed by detecting the number of slits of the reference chucks E11 to E31 by the scan heads E12 to E32 by continuously emitting two kinds of pulses from the scan heads E12 to E32 to the reference chucks E11 to E31. Further, the direction of the movement of the scan heads E12 to E32 with respect to the reference chucks E11 to E31 can be detected by checking which of the emitted pulses returns. Accordingly, in the probe apparatus 1 having the first to the third linear scale E1 to E3 of the present embodiment, the positions of the first to the third stage 21 to 23 on the coordinates can be measured in terms of data of the absolute coordinate system based on the origins of the reference chucks E11 and E31 by detecting rightward and downward movement of each of the scan heads E12 to E32 as "+" and leftward or upward movement thereof as "−".

Figure 3:
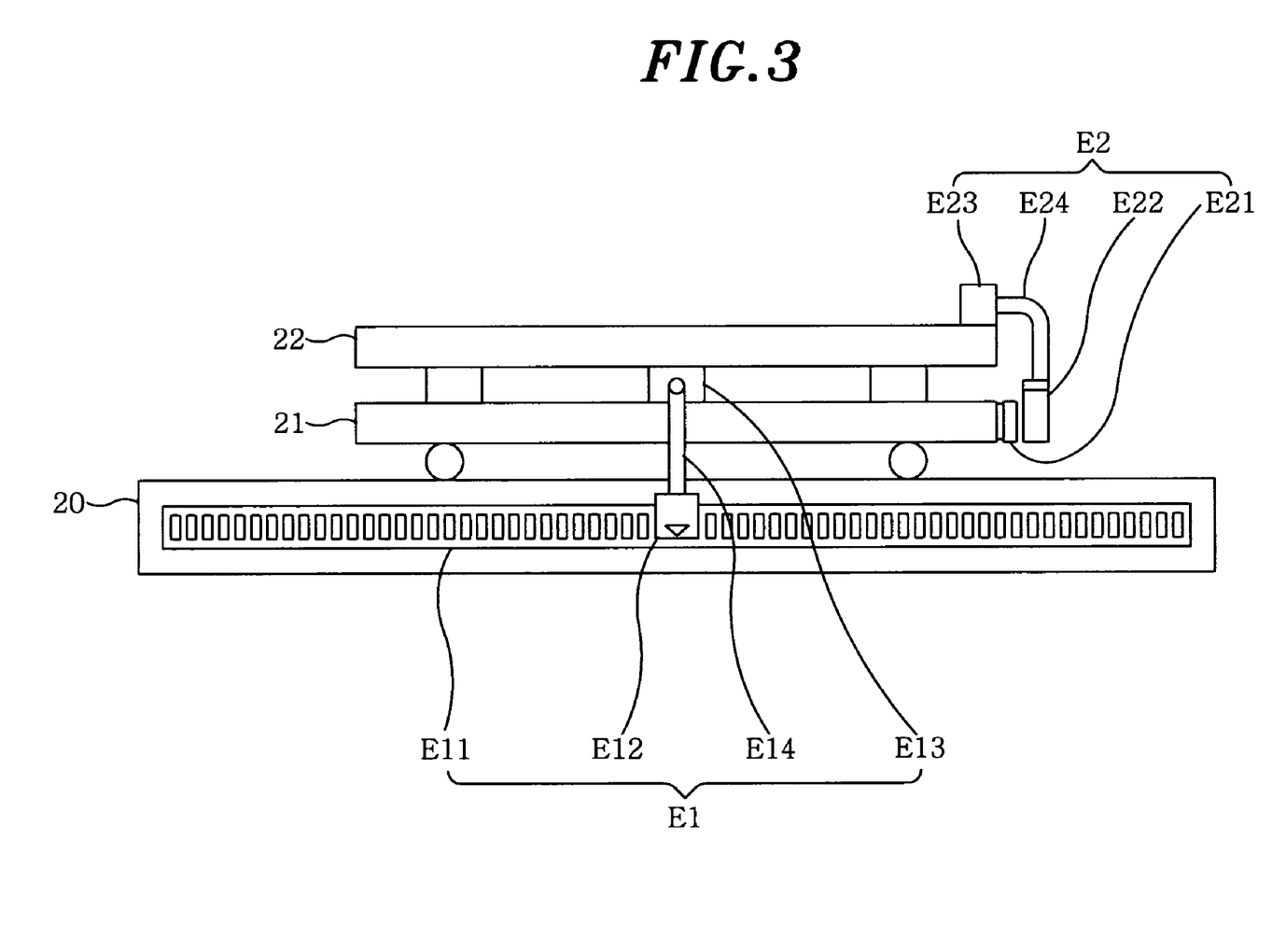
FIG. 3 schematically illustrates a first and a second stage 21 and 22 of the embodiment of the present invention, which is seen from a first linear scale E1 side.
Figure 4:
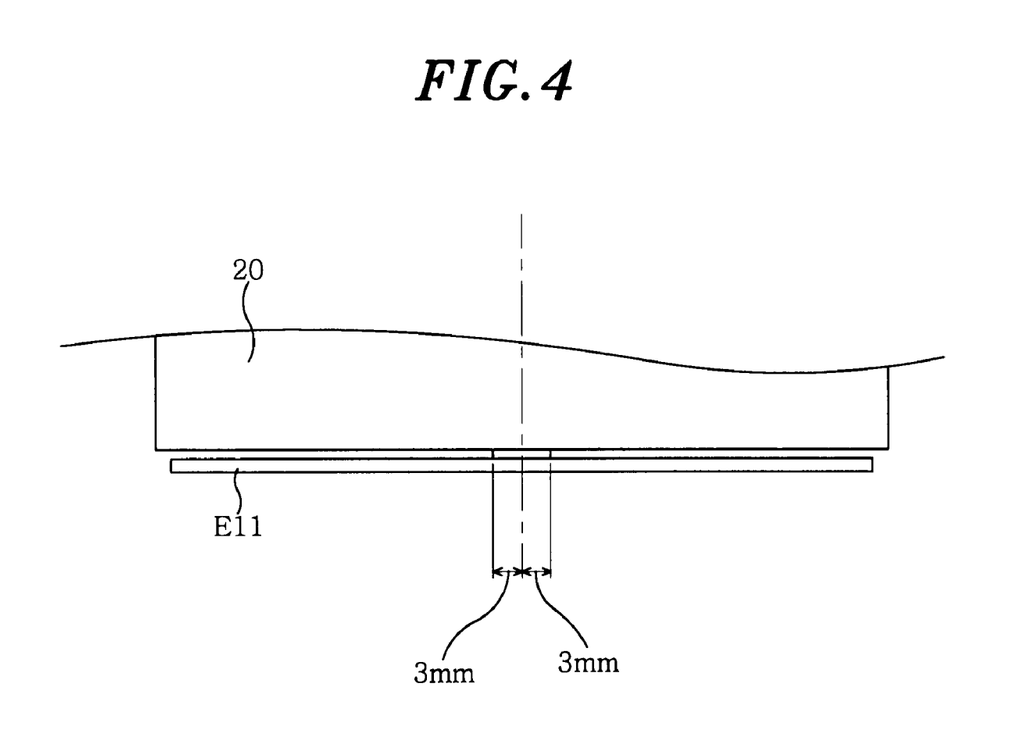
FIG. 4 presents a schematic view for explaining a fixed structure of the first linear scale E1 of the embodiment of the present invention.

As shown in FIG. 3, the reference chuck E11 is fixed to a central portion in an X direction of a side surface of the base table 20 (in the present embodiment, within the area separated from the central line in the X direction of the base table 20 by, e.g. about 3 mm, rightward and leftward) by an epoxy resin as a fixing member. At this time, the reference chuck E11 is fixed thereto while being slightly departed from the base table 20, as depicted in FIG. 4. The reference chuck E11 is fixed at a single portion of the central region to the base table 20 and is fixed to have the horizontality thereof to be preserved. Further, the scan head E12 is fixed to a central portion in an X direction of the top surface of the first stage 21 (in the present embodiment, within the area separated from the central line in the X direction of the first stage 21 by, e.g. about 3 mm, rightward and leftward) via the supporting member E14 such that the reference chuck E11 can be read. Moreover, as in the first linear scale E1, the reference chuck E21 is fixed to the side surface of the first stage 21, i.e., to the central portion in the Y direction of the first stage 21. Furthermore, as in the first linear scale E1, the scan head E22 is fixed to a central portion in the Y direction of the second stage 22 by the fixing unit E23 and the supporting member E24.

Figure 5A:
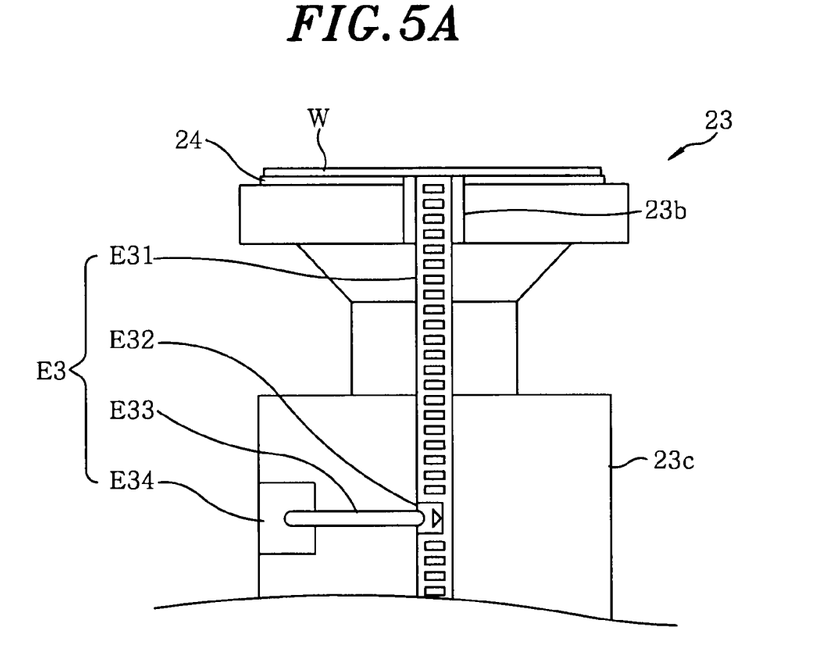
FIGS. 5A and 5B represent a schematic view for explaining a fixed structure of a third linear scale E3 of the embodiment of the present invention.
Figure 5B:
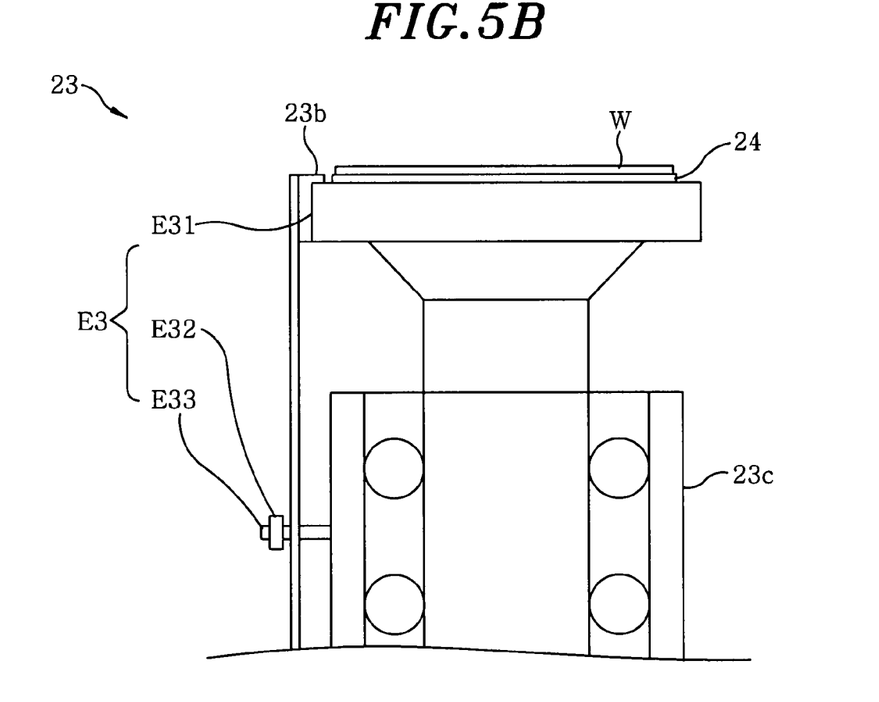

Further, as described in FIGS. 5A and 5B, one end side of the reference chuck E31 is adhered by an epoxy resin serving as a fixing member to a scale suspension 23b suspended on a surface where the chuck top 24 of the stage moving body 231 is provided. When the reference chuck E31 is adhered to the scale suspension 23b, the end portion thereof is preferably fixed at a place near the mounting surface of the chuck top 24 of the third stage 23 so that it can be positioned within, e.g., 5 mm from the mounting surface. Besides, the scan head E32 is fixed to the fixing unit E33 provided at a stage base 23c of the third stage 23 fixed on the second stage 22 via the supporting member E34 so that the reference chuck E31 can be read. Thus, in the probe apparatus 1 of the present embodiment, by arranging the first to the third linear scale E1 to E3 in the above-described manner, the position of the wafer chuck 24 can be measured in terms of coordinates on X, Y and Z axes.

Furthermore, in the present embodiment, incremental linear encoders LIDA483 with very high accuracy from HEIDENHAIN Corp. are used as the first to the third linear scale E1 to E3. The reference chucks E11, E21 and E31 are made of Zerodur glass ceramic (Zerodur being registered trademark of SCHOTT AKTIENGESELLSCHAFT) having a very small thermal expansion coefficient in order to prevent the coordinate position measurement precision from being affected by the change in the wafer W heating temperature during the measurement of the electrical characteristics of the wafer W. In addition, the scale suspension 23b is made of a material having a thermal expansion coefficient same as that of the material forming the reference chucks.

However, the embodiment of the present invention is not limited thereto, and another linear scale may be used as long as it has the same operation and effect as those of the above-described linear scale.

Figure 6:
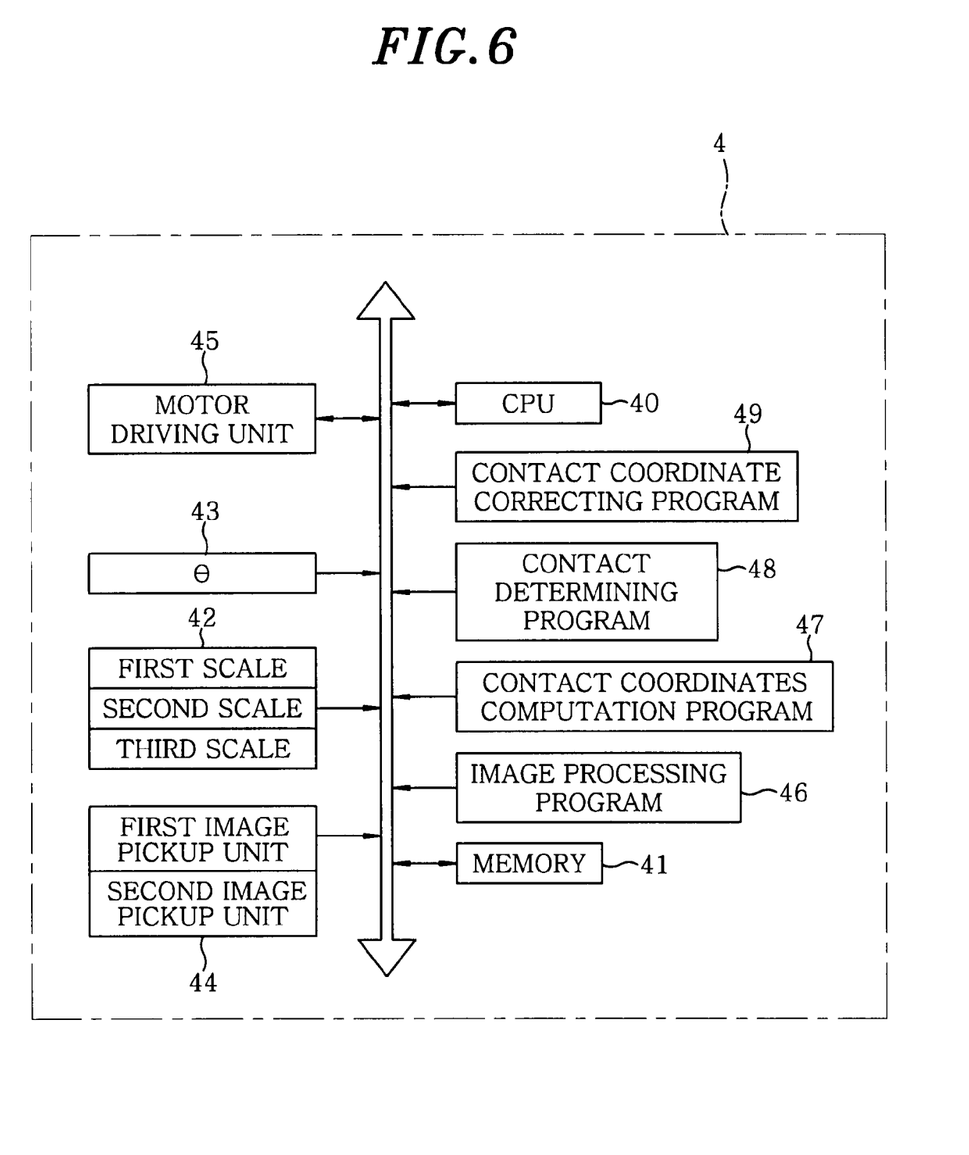
FIG. 6 offers a schematic configuration view of a control unit 4 of the embodiment of the present invention.

The above-described first to third linear scale E1 to E3 transmit data of the measured coordinate positions to a control unit 4 connected to the first to the third linear scale E1 to E3. FIG. 6 schematically illustrates principal parts of the control unit 4 of the present embodiment. As shown in FIG. 6, the control unit 4 has a CPU 40, a work memory 41 serving as a work area for the CPU 40, a coordinate data input unit 42 for inputting measured position coordinates from the first to the third linear scale E1 to E3, a rotation amount input unit 43 for inputting a rotation amount of the chuck top 24, a picked-up image data input unit 44 for inputting picked-up image data of the first and the second image pickup unit 25 and 33, and a motor driving unit 45 for controlling driving of a motor (not shown) as a driving source of the first to the third stage 21 to 23 and the chuck top 24.

Further, the control unit 4 has an image processing program 46 for processing the input picked-up image data, a contact coordinate computation program (operation unit) 47 for obtaining contact coordinates of a contact position between the wafer W and the probes 32 based on the picked-up image data processed by using the image processing program 46, a contact determining program 48 for determining whether or not the contact operation is performed normally by monitoring a contact state between the electrode pads of the wafer W and the probes 32 or a coordinate position of the chuck top 24, and a coordinate correcting program 49 which corrects the contact coordinates when the contact position is displaced. These programs are stored in a storage unit (not shown), e.g., a computer storage medium, such as a flexible disc, a compact disc, an MO (magneto-optical disc), a hard disc, and are executed in the control unit 4.

Hereinafter, the operation of the present embodiment will be described. First, a wafer W roughly aligned by pre-alignment carried out on several central points to determine, e.g., its direction is mounted on the chuck top 24 and, then, the target 28 is moved into the space between the first image pickup unit 25 and the second image pickup unit 33. The focus of the first image pickup unit 25 and that of the second image pickup unit 33 are aligned with the position of the target 28. Thereafter, the target 28 is retreated. The images of the probes 32 of the probe card 31 are picked up by moving the first image pickup unit 25, and the images of the electrode pads of the IC chips of the wafer W are picked up by moving the second image pickup unit 33.

In this probe apparatus 1, the focuses of the first image pickup unit 25 and the second image pickup unit 33 can be aligned, so that the images of the wafer W and the probe card 31 can be picked up by a common image pickup unit. Next, the picked-up image data transmitted from both of the image pickup units are received by the picked-up image data input unit 44, and then are processed by the image processing program 46. The processing result is inputted to the contact coordinate computation program 47 so as to perform the computation. As a consequence, the contact coordinates between the wafer W and the probe card 31 are determined.

After the contact coordinates are determined, the data of the determined contact coordinates are stored in the storage area of the work memory 41 by the control unit 4 of the probe apparatus 1, and the electrical characteristics of the wafer W are measured. That is, the probe apparatus 1 reads out the contact position stored in the storage area, i.e., the coordinates on the X, Y and Z axes which are managed by the first to the third linear scale E1 to E3.

Further, in order to move the chuck top 24 to the contact position, the driving pulses are supplied from the motor driving unit 45 to each motor (not shown) via the control unit 4. Moreover, the first to the third stage 21 to 23 are moved so that the wafer W contacts with the probe card 31 in a vertical direction, i.e., in a direction parallel to the Z-axis. Besides, the position coordinates of the respective stages are measured by the first to the third linear scale E1 to E3, and are inputted to the control unit 4 via the coordinate data input unit 42. If the inputted measured values are the same as the contact coordinates, the supply of the driving pulse from the motor driving unit 45 is stopped.

Next, in the probe apparatus 1, the wafer W and the probes 32 are brought into contact with each other and, in that state, the chuck top 24 is slightly raised to apply an overdrive. Accordingly, the natural oxide film is scratched by the probes 32, and the partial contact in which a part of the electrode pads of the wafer W contacts with the probes 32 is performed to measure the electrical characteristics of the wafer W.

After the electrical characteristics of the wafer W at the above measuring portion is completed, the chuck top 24 is lowered to separate the wafer W from the probes 32, and then is moved to a portion where the probes 32 contact with a next measuring portion of the wafer W. When the wafer W is made to contact with the probes 32 and is overdriven, the electrical characteristics of the wafer W are measured. Thereafter, these processes are repetitively carried out on all IC chips, thereby completing the measurement of the characteristics of all IC chips.

In this probe apparatus 1, the position in the Z-axis direction of the third stage 23 is measured in terms of data of the absolute coordinate system managed by the third linear scale E3. Therefore, even when the third stage 23 is extended or contracted, the contact position is not displaced. The features of the third stage 23 and the third linear scale E3 will be described with reference to FIGS. 7A to 7C. Here, FIGS. 7A to 7C explain a relationship between the third linear scale E3 and the third stage 23.

In the probe apparatus 1 of the present embodiment, the data of the coordinates of the mounting position and the determined contact coordinates are stored in the work memory 41, and the contact is executed based on the data such as the stored contact coordinates and the like.

Figure 7A:
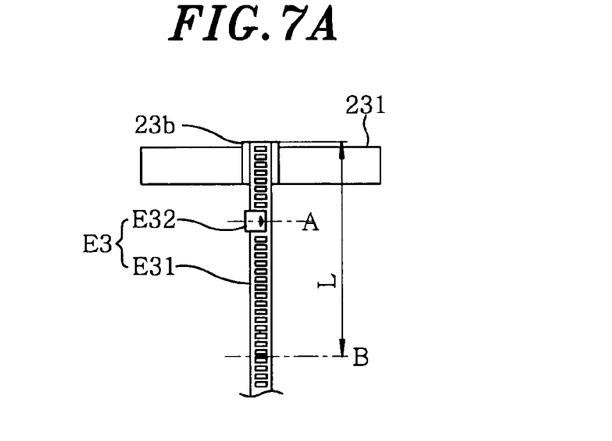
FIGS. 7A to 7C explain a relationship between the third linear scale E3 and a third stage 23 in the embodiment of the present invention.

Here, for convenience of explanation, a coordinate point A of the Z-axis direction which is spaced by a predetermined distance from the origin shown in FIG. 7A is set to the mounting position of the wafer W, and a coordinate point B spaced by 15 scales from the coordinate point A is set to the contact coordinate, both coordinate data being stored in the work memory 41. Since the length of the reference chuck E31 is not changed, the distance L between the top surface of the third stage 3 and the coordinate B point is constant.

In the probe apparatus 1 of the present embodiment, when it is checked that the third stage 23 has reached the coordinate point A by the contact determining program 48 of the control unit 4, the third stage 23 is determined to be positioned in the mounting position, and the movement thereof is stopped. On the other hand, if it is checked that the third stage 23 has reached the coordinate point B by the contact determining program 48, the third stage 23 is determined to be positioned in the contact position, and the movement thereof is stopped.

Figure 7B:
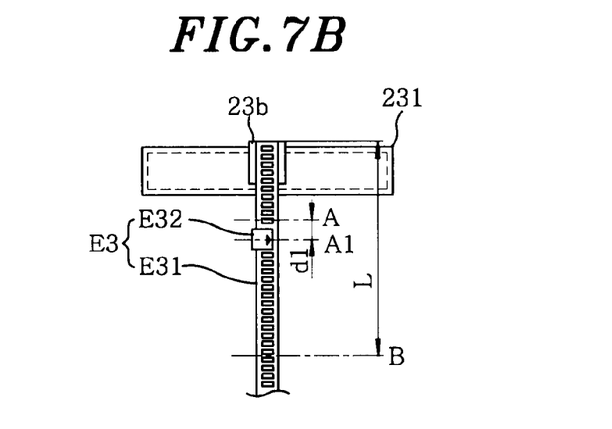

When the third stage 23 is extended by, e.g., thermal expansion or the like, from the state of FIG. 7A to the state of FIG. 7B, the position of the chuck top 24 in the Z-axis direction is raised, and the reference chuck E31 moves upward by a distance d1. Therefore, if the third stage 23 is extended while it remains stopped at the mounting position, the coordinates read by the scan head E32 is shifted to A1. On the other hand, when the third stage 23 is contracted from the state of FIG. 7A to the state of FIG. 7C, the reference chuck E31 is lowered by a distance d2. For that reason, if the third stage 23 is contracted while it remains stopped at the mounting position, the coordinates read by the scan head E32 is shifted to A2.

Figure 7C:
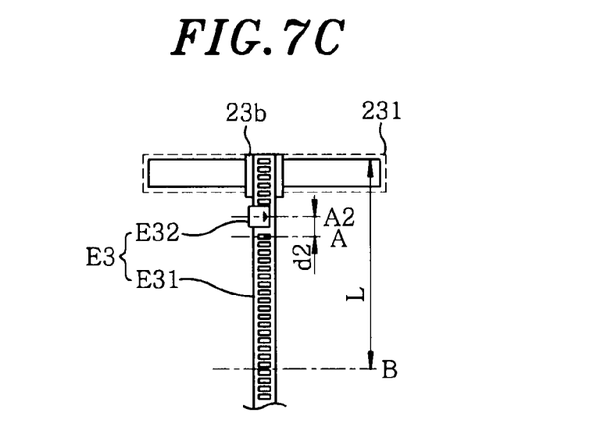

However, when it is checked that the scan head E32 has reached the coordinate B point corresponding to the contact position, the control unit 4 of the probe apparatus 1 determines that the third stage 23 has reached the contact position and stops the movement thereof. Further, since the distance L between the coordinate B point and the top surface of the third stage 23 is constant, the position where the top surface of the third stage 23 stops is not changed even if the third stage 23 is extended or contracted.

Hence, in the probe apparatus 1 of the present embodiment, the presence of the third linear scale E3 makes it possible to bring the wafer W into contact with the probes 32 with high accuracy even when the third stage is extended or contracted in the Z-axis direction.

Besides, the probe apparatus 1 of the present embodiment is provided with the contact determining program 48 and the coordinate correcting program 49 of the control unit 4 so that the highly reliable measurement can be performed even when the displacement of the Z-axis direction, which cannot be detected by the third linear scale E3, occurs due to extension or contraction of the first and the second stage 21 and 22 in the Z-axis direction by thermal expansion and thermal contraction, bending of the probe card 31 by thermal expansion or thermal contraction, extension and contraction of the probes 32 by thermal expansion and thermal contraction, and the like. Hereinafter, the correction of the contact coordinates in the probe apparatus 1 of the present embodiment will be described with reference to FIGS. 8 and 9.

Figure 8:
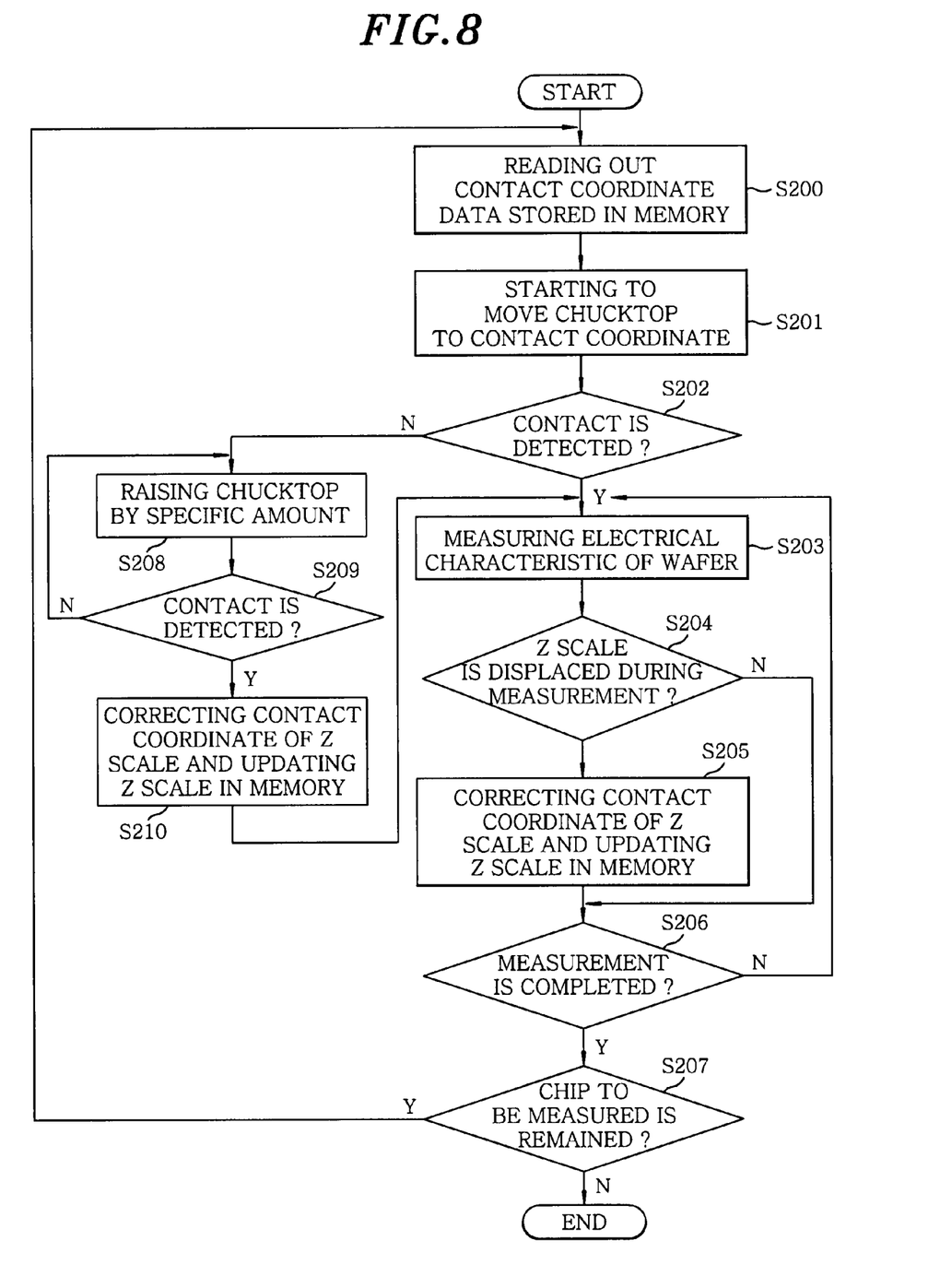
FIG. 8 is a flowchart for explaining correction of displacement of contact coordinates in the embodiment of the present invention.
Figure 9A:
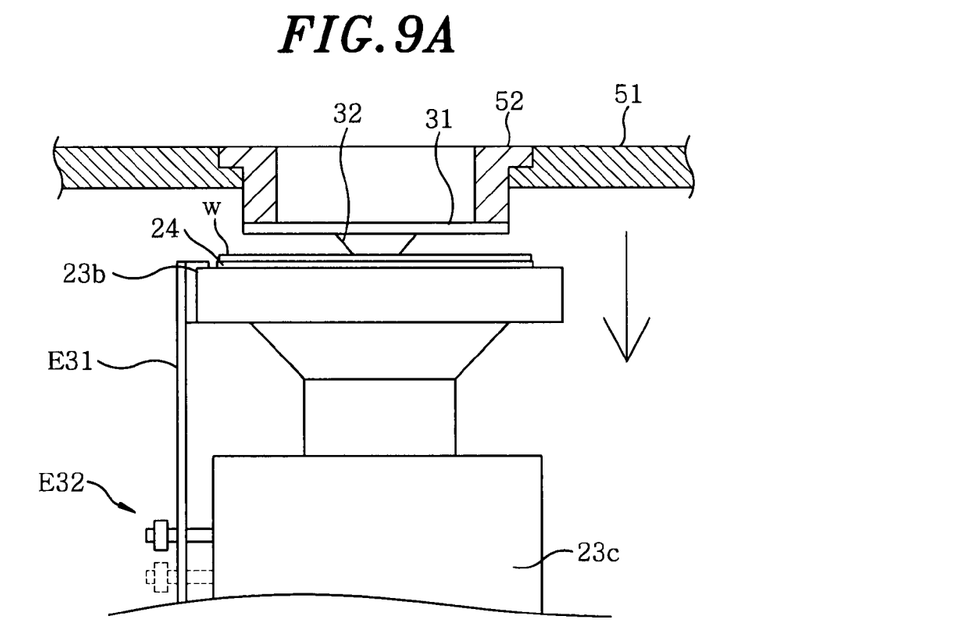
FIGS. 9A and 9B explain correction of a contact position in the embodiment of the present invention.
Figure 9B:
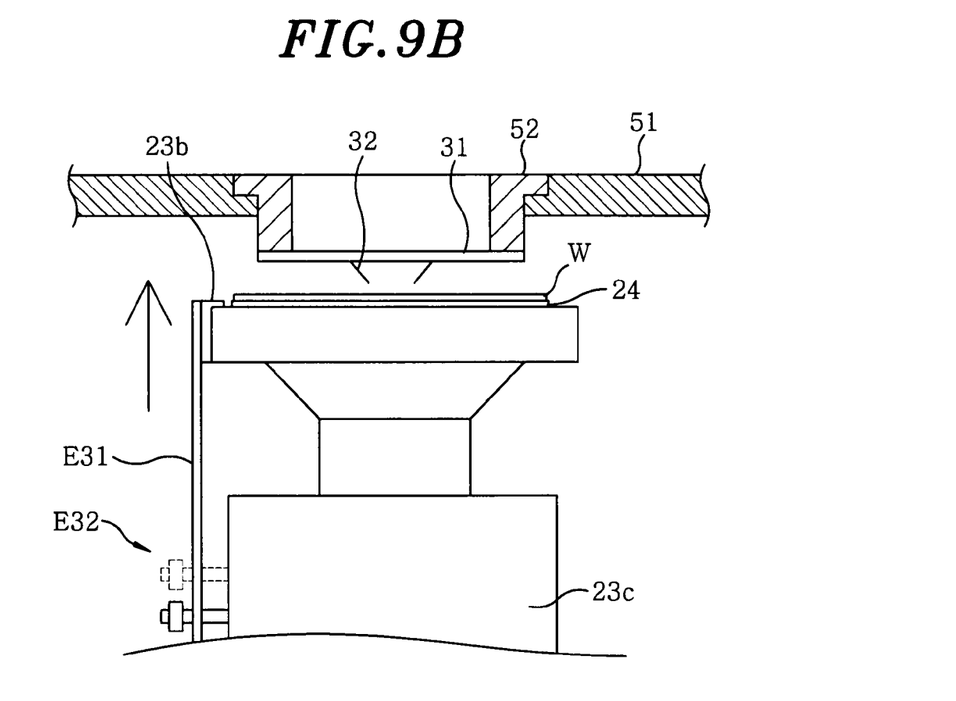

FIG. 8 is a flowchart for explaining the correction process of the displacement of the contact coordinates which is caused by extension or contraction of the probe card 31 and the first to the third stage 21 to 23; and FIGS. 9A and 9B explain the correction process of the contact position illustrated in FIG. 8. In the probe apparatus 1 of the present embodiment, the contact state between the probes 32 and the wafer W or the coordinate position of the chuck top 24 is monitored by the contact determining program 48 of the control unit 4.

As shown in FIG. 8, in a step S200, the contact determining program 48 reads out the data of the contact coordinates between the wafer W and the probes 32 which are stored in the storage area of the work memory 41. In a step S201, the first to the third stage 21 to 23 start to move so that the chuck top 24 can move toward the position given by the absolute coordinates of the contact position based on the read-out data.

Next, in a step S202, the contact determining program 48 detects the contact status between the wafer W and the probes 32 by a measurement device (not shown) connected to the probe card 31. If the contact between the wafer W and the probes 32 is detected, electrical characteristics of measurement target IC chips of the wafer W are measured in a step S203 by scratching the natural oxide film with the use of the probes 32 in a state where the electrode pads of the wafer W are brought into contact with the probes 32 by slightly raising the chuck top 24 to apply an overdrive.

In the probe apparatus 1 of the present embodiment, the third linear scale E3 is monitored in a step S204 during the measurement of the electrical characteristics of the measurement target IC chips of the wafer W. If the third linear scale E3 is not displaced, it is checked in a step S206 whether or not the measurement of the electrical characteristics of the measurement target IC chips of the wafer W is completed. When it is checked that the measurement is not completed, the process returns to the step S203, and the measurement of the electrical characteristics of the IC chips and the monitoring of the third linear scale E3 are continued until it is checked in the step S206 that the measurement of the electrical characteristics of the measurement target IC chips of the wafer W is completed.

If the completion of the measurement of the wafer W is confirmed in the step S206, it is checked in a step S207 whether or not the wafer W still has remaining target IC chips to be measured. If it is checked that the wafer W still has remaining target IC chips to be measured, the above processes are repeated by reading out the coordinate data of the contact position of next IC chips of the wafer W in a step S200. If the wafer W has no remaining target IC chips to be measured, it is determined that the measurement of the electrical characteristics of the wafer W is completed, and the measuring operation is completed.

When the extension of the first and the second stage 21 and 22 in the Z-axis direction by thermal expansion or the extension of the probes 32 by thermal expansion occurs during the measurement of the electrical characteristics of the wafer W as shown in FIG. 9A, the displacement of the third linear scale E3 is detected during the measurement of the electrical characteristics of the wafer W in the step S204. If the displacement between the contact coordinates and the actual contact position of the wafer W and the probes 32 is detected in the step S204, the contact determining program 48 determines that the contact operation is abnormal. Then, in a step S205, the measured value of the third linear scale E3 at that time is stored in the work memory 41.

Next, the coordinate data of the contact position stored in the work memory 41 is corrected by the coordinate correcting program 49 based on the measured value of the third linear scale E3 that is stored in the work memory 41, thereby updating the coordinate data of the contact position. After the coordinates of the contact position are corrected in the step S205, it is checked in a step S206 whether or not the measurement of the electrical characteristics of the measurement target IC chips of the wafer W is completed. When the measurement is not completed, the process returns to the step S203, and the above processes are repeated to measure the electrical characteristics of the IC chips of the wafer W.

When the contraction of the first and the second stage 21 and 22 in the Z-axis direction by thermal contraction or the contraction of the probes 32 by thermal contraction occurs as shown in FIG. 9B, the contact between the wafer W and the probes 32 is not detected in the step S202 and, thus, the displacement of the contact position can be detected. If the displacement of the contact position is detected in the step S202, the chuck top 24 is raised in a step S208 by a specific amount, e.g., one scale of the reference chuck E31, by the contact determining program 48, and the process of the step S208 is repeated until the contact between the wafer W and the probes 32 is detected in a step S209. If the contact between the wafer W and the probes 32 is detected in the step S209, the measured value of the third linear scale E3 at that time is stored in the work memory 41 in a step S210.

Thereafter, the coordinate data of the contact position stored in the work memory 41 is corrected by the coordinate correcting program 49 based on the measured value of the third linear scale E3 which is stored in the work memory 41, thereby updating the coordinate data of the contact position. After the coordinates of the contact position are corrected in the step S210, the electrical characteristics of the measurement target IC chips of the wafer W are measured in the step S203 by scratching the natural oxide film with the use of the probes 32 in a state where the electrode pads of the wafer W are brought into contact with the probes 32 by slightly raising the chuck top 24 to apply an overdrive. Next, the electrical characteristics of the IC chips are measured by performing the above-described processes.

Thus, in the probe apparatus 1 of the present embodiment, the electrical characteristics of all IC chips of the wafer W can be measured by performing the processes described in FIG. 8. Moreover, when the electrical characteristics of the IC chips are measured while bringing the wafer W into contact with the probes 32, it is constantly checked by the contact determining program 48 whether or not the contact position between the wafer W and the probes 32 is displaced. If the displacement is detected, the contact position is automatically corrected by the coordinate correcting program 49.

When the electrical characteristics of the wafer W are measured in a state where the wafer W is heated by the heating unit 23d or is cooled by the coolant circulation unit 23e, the first and the second stage 21 and 22 or the probe card 31 is extended or contracted in the Z-axis direction in addition to the third stage 23 and, hence, the contact coordinates determined by the computation become different from the coordinates of the actual contact position. However, the displacement of the Z-axis direction by extension or contraction can be detected, and the contact position can be automatically corrected in accordance with the detected displacement. As a consequence, in the probe apparatus 1 of the present embodiment, the excellent contact precision between the electrode pads of the wafer W and the probes 32 is provided, thereby improving the reliability of the measurement of the electrical characteristics.

Further, in the probe apparatus 1 of the present embodiment, the coordinates of the X and Y axes are measured by the first and the second linear scale E1 and E2 in which each of the reference chucks E11 and E21 and the scan heads E12 and E22 is fixed to a single point at a center of a member. For that reason, even if the member to which each of the reference chucks or each of the scan heads is fixed is deformed by thermal expansion, the fixed position of the respective reference chucks or the respective scan heads is not changed since the point where each of the reference chucks and the scan heads is fixed is the center point of the thermal expansion, As a result, the relative position between the reference chucks and the scan heads is not changed.

Further, the measurement precision of the reference chucks E11 and E21 is not deteriorated at a temperature to which the wafer is heated. Therefore, even when the member to which the reference chucks or the scan heads are fixed is deformed by thermal expansion, the coordinate positions of the first and the second stage 21 and 22 can be measured with the precision same as that applied before the fixing member is deformed.

In the above probe apparatus 1, the reference chuck E31 of the third linear scale E3 is fixed at a position near the mounting table of the chuck top 24 of the third stage 23 so that it can be positioned within, e.g., about 5 mm from the mounting surface, and the scan head E32 is fixed to the non-driving unit of the third stage 23. The position of the driving unit of the third stage 23 on which the chuck top 24 is mounted can be measured by the third linear scale E3 having constant measurement performance, so that the displacement amount of the contact position of the third stage 23 can be detected. When the displacement is detected, the contact position in the Z-axis direction can be corrected based on the displacement amount.

Hence, in the probe apparatus 1, even if the contact position has an error caused by thermal expansion or the like during the measurement, the excellent precise contact between the electrode pads of the wafer W and the probes 32 can be provided by correcting the error automatically. As a result, the reliability of the measurement of the electrical characteristics can be improved.

Moreover, in the probe apparatus 1 of the present embodiment, when the contact between the wafer W and the probes 32 is detected, the chuck top 24 is slightly raised and is overdriven in steps S207 and S209. Accordingly, the natural oxide film is scratched by the probes 32, and the electrical characteristics are measured in a state where the probes 32 contact with the electrode pads of the wafer W. However, the embodiment of the present invention is not limited thereto.

For example, it may be preferable to determine whether or not the stage or the probe card is being extended or contacted after waiting for a specific period of time, for example, standing by 10 seconds, from the time detecting the contact between the wafer and the probes.

While the invention has been shown and described with respect to the embodiments, it will be understood by those skilled in the art that various changes and modification may be made without departing from the scope of the invention as defined in the following claims.

What is claimed is:

1. A probe apparatus for measuring electrical characteristics of chips to be inspected while bringing probes of a probe card into contact with electrode pads of the chips by moving a mounting table which mounts thereon a substrate to be inspected where the chips are arranged, the probe apparatus comprising:
   a first stage provided on a base table so as to be movable in an X direction;
   a second stage provided on the first stage so as to be movable in a Y direction;
   a third stage provided on the second stage so as to be movable in a Z direction and having the mounting table;
   an image pickup for picking up images of the probes and the substrate to be inspected on the mounting table;
   a Z position measuring unit which acquires a Z direction position of the mounting table and has a Z scale extending in the Z direction and a reading unit for reading the Z scale, the Z scale being provided at one side of the second and the third stage, the reading unit being provided at the other side of the second and the third stage;
   a computation unit for obtaining a calculated contact position between the probes and the electrode pads of the substrate based on the images picked up by the image pickup with respect to a coordinate position on coordinates of a driving system which includes a Z direction position and X and Y direction positions measured by a measuring unit for measuring X and Y direction positions of the mounting table; and
   a correcting unit for correcting, when the Z direction position of the mounting table measured by the Z position measuring unit is different from a preset calculated contact position in a state where the probes contact with the electrode pads of the substrate, the Z direction position of the contact position based on a change amount thereof for a next contact operation.

2. The probe apparatus of claim 1, wherein the third stage has a heating unit for heating the substrate to be inspected mounted on the mounting table.

3. The probe apparatus of claim 1, wherein the measuring unit for measuring the X direction position of the mounting table has an X scale extending in the X direction and a reading unit for reading the X scale, the X scale being fixed to one side of central portions in the X direction of the base table and the first stage, the reading unit being provided at the other side of the base table and the first stage, and
   wherein the measuring unit for measuring the Y direction position of the mounting table has a Y scale extending in the Y direction and a reading unit for reading the Y scale, the Y scale being fixed to one side of central portions in the Y direction of the first and the second stage, the reading unit being provided at the other side of the first and the second stage.

4. The probe apparatus of claim 2, wherein the measuring unit for measuring the X direction position of the mounting table has an X scale extending in the X direction and a reading unit for reading the X scale, the X scale being fixed to one side of central portions in the X direction of the base table and the first stage, the reading unit being provided at the other side of the base table and the first stage, and wherein the measuring unit for measuring the Y direction position of the mounting table has a Y scale extending in the Y direction and a reading unit for reading the Y scale, the Y scale being fixed to one side of central portions in the Y direction of the first and the second stage, the reading unit being provided at the other side of the first and the second stage.

5. A probing method for measuring electrical characteristics of chips to be inspected by bringing probes of a probe card into contact with electrode pads of the chips by moving a mounting table which mounts thereon a substrate to be inspected on which the chips are arranged, a probe apparatus including:

a first stage provided on a base so as to be movable in an X direction;

a second stage provided on the first stage so as to be movable in a Y direction;

a third stage provided on the second stage so as to be movable in a Z direction and having the mounting table; and a Z position measuring unit which measures a Z direction position of the mounting table and has a Z scale extending in the Z direction and a reading unit for reading the Z scale, the Z scale being provided at one side of the second and the third stage, the reading unit being provided at the other side of the second and the third stage, the probing method comprising:

performing a computation to obtain a calculated contact position between the probes and the electrode pads of the substrate based on pick-up images of the probes and the substrate to be inspected on the mounting table with respect to a coordinate position on coordinates of a driving system which includes a Z direction position and X and Y direction positions measured by a measuring unit for measuring X and Y direction positions of the mounting table; and correcting, when the Z direction position of the mounting table measured by the Z position measuring unit is different from a preset calculated contact position in a state where the probes contact with the electrode pads of the substrate, the Z direction position of the contact position based on a change amount thereof for a next contact operation.

6. A non-transitory computer-readable storage medium including computer executable instructions used in a probe apparatus for inspecting electrical characteristics of chips to be inspected while contacting electrode pads of the chips to be inspected with probes of a probe card by moving a mounting table which mounts thereon a substrate to be inspected on which the chips to be inspected are arranged, the mounting table being movable in X, Y and Z direction by a driving unit, wherein said probe apparatus including:

a first stage provided on a base so as to be movable in an X direction;

a second stage provided on the first stage so as to be movable in a Y direction;

a third stage provided on the second stage so as to be movable in a Z direction and having the mounting table; and a Z position measuring unit which measures a Z direction position of the mounting table and has a Z scale extending in the Z direction and a reading unit for reading the Z scale, the Z scale being provided at one side of the second and the third stage, the reading unit being provided at the other side of the second and the third stage, wherein the instructions, when executed by a processor, cause the processor to perform the probing method of:

performing a computation to obtain a calculated contact position between the probes and the electrode pads of the substrate based on pick-up images of the probes and the substrate to be inspected on the mounting table with respect to a coordinate position on coordinates of a driving system which includes a Z direction position and X and Y direction positions measured by a measuring unit for measuring X and Y direction positions of the mounting table; and correcting, when the Z direction position of the mounting table measured by the Z position measuring unit is different from a preset calculated contact position in a state where the probes contact with the electrode pads of the substrate, the Z direction position of the contact position based on a change amount thereof for a next contact operation.

\* \* \* \* \*